United States Patent
Lin et al.

(10) Patent No.: US 8,843,860 B2
(45) Date of Patent: Sep. 23, 2014

(54) FRAME CELL FOR SHOT LAYOUT FLEXIBILITY

(75) Inventors: Chin-Ming Lin, Jhunan Township, Miaoli County (TW); Chia-hung Huang, Hsinchu (TW); Chi-Ming Yang, Hsinchu (TW); Chin-Hsiang Lin, Hsin-chu (TW); Yung-Cheng Chen, Jhubei (TW); Chih-Wei Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/409,517

(22) Filed: Mar. 1, 2012

(65) Prior Publication Data

US 2012/0181669 A1    Jul. 19, 2012

Related U.S. Application Data

(63) Continuation-in-part of application No. 12/537,836, filed on Aug. 7, 2009, now Pat. No. 8,239,788.

(51) Int. Cl.
 *G06F 17/50*  (2006.01)
 *G03F 7/20*  (2006.01)

(52) U.S. Cl.
 CPC .................................. *G03F 7/70433* (2013.01)
 USPC .................................. 716/54; 716/55; 716/50

(58) Field of Classification Search
 None
 See application file for complete search history.

(56) References Cited

U.S. PATENT DOCUMENTS

| | | | |
|---|---|---|---|
| 6,016,391 A * | 1/2000 | Facchini et al. | 716/55 |
| 6,433,352 B1 | 8/2002 | Oka | |
| 6,546,544 B1 | 4/2003 | Kawakami | |
| 6,604,233 B1 * | 8/2003 | Vickery et al. | 716/54 |
| 6,703,170 B1 * | 3/2004 | Pindo | 430/5 |
| 6,980,917 B2 | 12/2005 | Ward et al. | |
| 7,243,325 B2 | 7/2007 | McIntyre et al. | |
| 7,353,077 B2 | 4/2008 | Lin et al. | |
| 7,448,011 B2 | 11/2008 | Eshima | |
| 7,587,703 B2 | 9/2009 | Takita et al. | |
| 7,882,481 B2 | 2/2011 | Hempel | |
| 8,239,788 B2 * | 8/2012 | Lin et al. | 716/55 |
| 2002/0127747 A1 | 9/2002 | Maltabes et al. | |
| 2003/0163794 A1 | 8/2003 | Horie et al. | |
| 2009/0007028 A1 | 1/2009 | Hempel | |
| 2011/0033787 A1 | 2/2011 | Lin et al. | |
| 2012/0181669 A1 * | 7/2012 | Lin et al. | 257/620 |

* cited by examiner

*Primary Examiner* — A. M Thompson
(74) *Attorney, Agent, or Firm* — Duane Morris LLP

(57) ABSTRACT

A method includes establishing an initial shot layout in which a number of shots are arranged in vertically aligned columns and horizontally aligned rows to cover a semiconductor wafer. At least one of a row of shots or a column of shots is shifted relative to an adjacent row or column of shots to establish at least one additional shot layout that differs from the initial shot layout in that shots in the at least one shifted row or column of shots are not aligned with the shots in the adjacent row or column of shots with which they were aligned in the initial shot layout. One of the initial shot layout and the at least one additional shot layout is selected as a final shot layout. The wafer is exposed to light using the final shot layout.

19 Claims, 16 Drawing Sheets

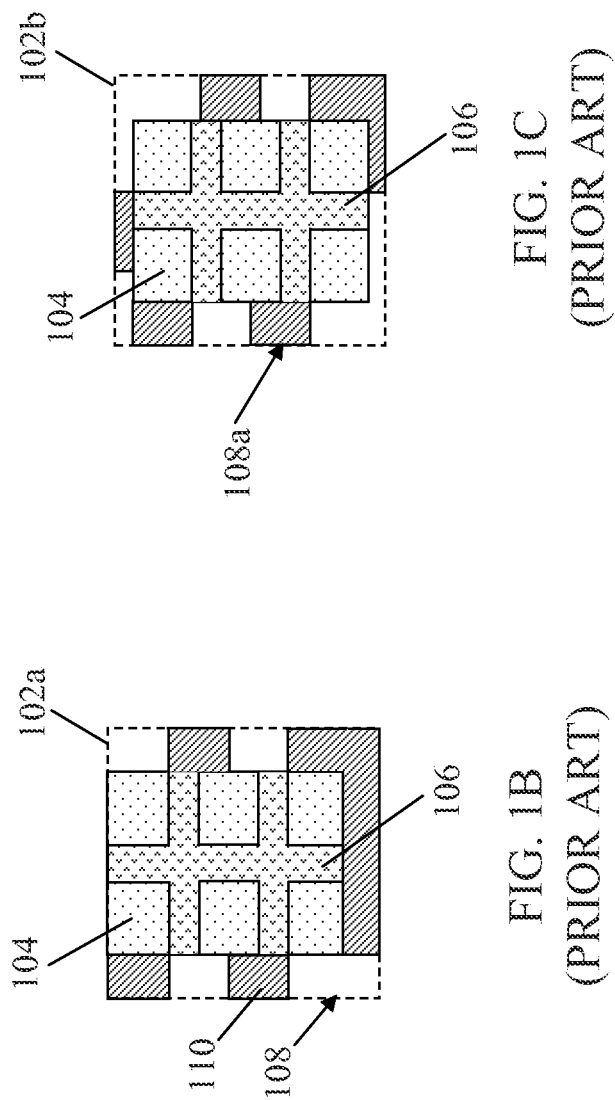

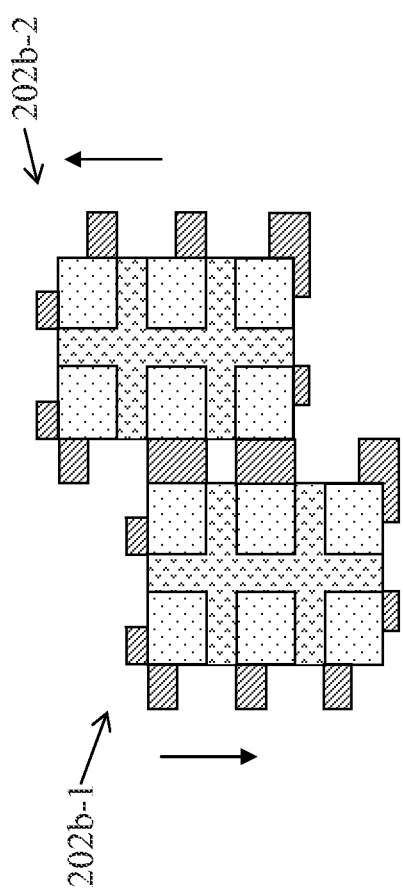

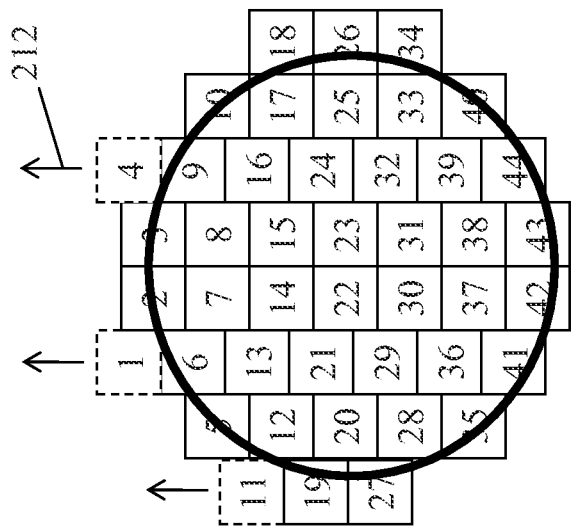
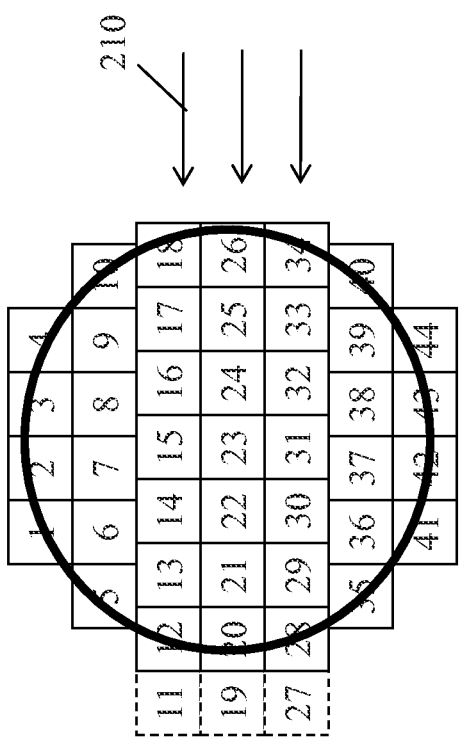
FIG. 5C
FIG. 5B

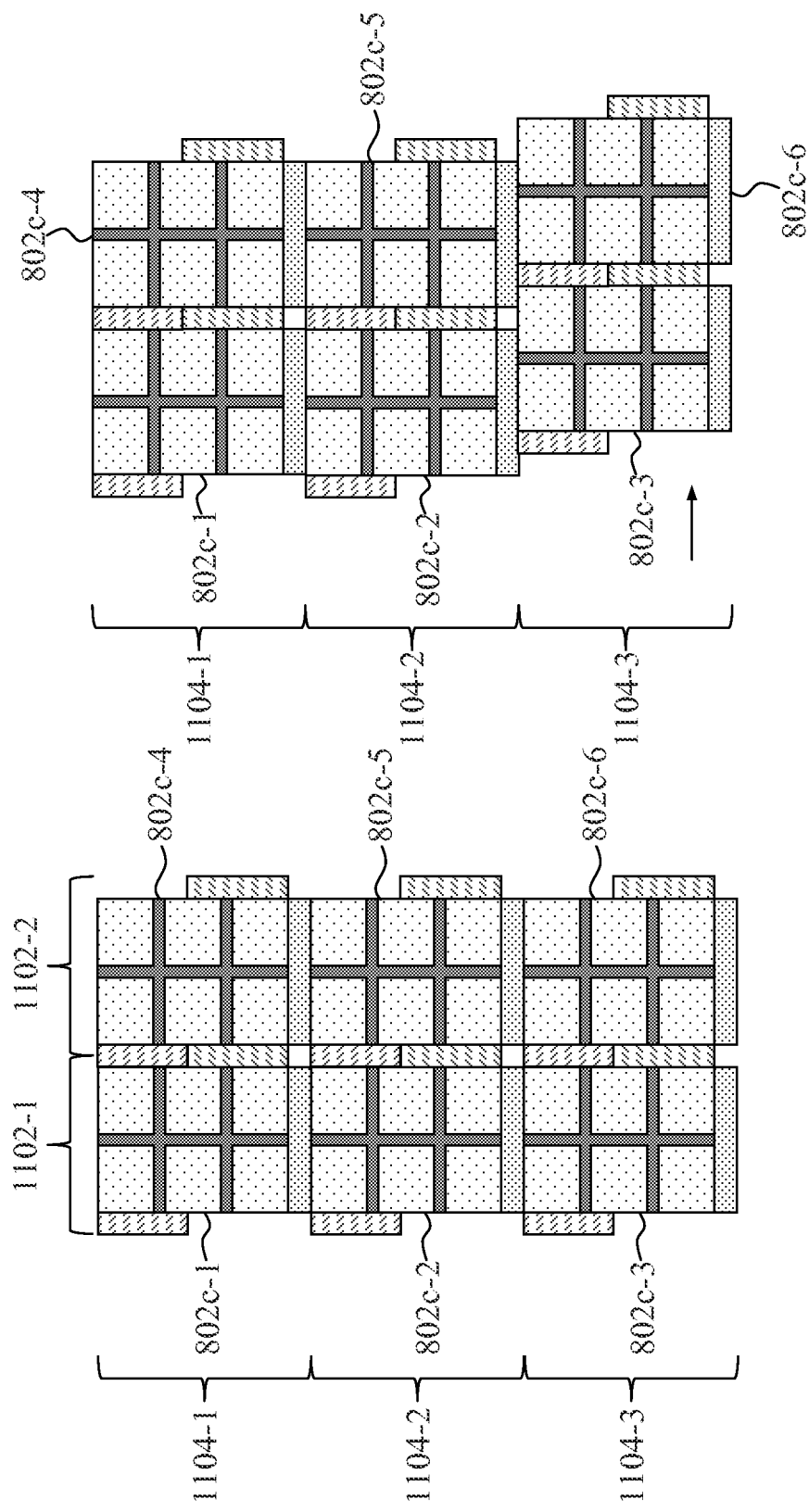

FRAME CELL FOR SHOT LAYOUT FLEXIBILITY

CROSS-REFERENCE TO RELATED APPLICATIONS

This application is a continuation-in-part of U.S. patent application Ser. No. 12/537,836, filed Aug. 7, 2009, the entirety of which is herein incorporated by reference.

FIELD OF DISCLOSURE

The disclosed system and method relate to semiconductor fabrication processes. More specifically, the disclosed system and method relate to frame cell design layouts in semiconductor manufacturing.

BACKGROUND

The formation of various integrated circuit (IC) structures on a semiconductor wafer typically involves lithographic processes. Lithographic processors are used to transfer a pattern of a photomask to the semiconductor wafer. For example, a pattern may be formed on the wafer by passing light energy through a reticle, which transfers the pattern to the photoresist layer. After exposing a photoresist layer, a development cycle is performed. In order to increase the resolution and the quality of the exposure of the photoresist, a reticle is usually configured to expose only a portion of the wafer at a time. Each portion of the wafer that is exposed at once is referred to as an exposure field or a "shot" area. Accordingly, developing an entire wafer usually requires a lithographic processor to take multiple shots.

FIG. 1A illustrates a wafer 100 having a plurality of shots 102 disposed thereon. Each exposure or shot area 102 may include one or more chips 104 separated by scribe lines or "streets" 106 as illustrated in FIGS. 1B and 1C. Additionally, each shot area may include one or more alignment and monitor patterns, e.g., frame structure segments 108, which are disposed outside of the area that includes the chips 104. The frame structure segments 108 are typically fixed segments within a shot area and that are located around the periphery of a shot. The frame structure segments are usually arranged in a U-frame configuration as illustrated FIG. 1B or in an O-frame configuration 108a as illustrated in FIG. 1C. The alignment and monitor patterns 108, 108a are used to align or monitor process variations of a shot 102. Additionally, the frame segments 108, 108a provide areas to separate adjacent shots 102 when the wafer has been developed. The exposure is performed by interlocking, but not overlapping, the frame cell structure segments 108 of adjacent shots as illustrated in FIGS. 2A and 2B.

In conventional processing methods as illustrated in FIG. 1A, shots 102 are fully aligned with adjacent shots in both the x- and y-directions. At the periphery of the wafer, the dies in each edge shot have vacant space adjacent thereto, between the outer sides of the dies and the circumference of the wafer. As wafer sizes increase from 300 mm to 450 mm, the number of edge shots will also increase as a 450 mm wafer has approximately 1.5 times the circumference of a 300 mm wafer, increasing the amount of vacant, wasted space on the wafer.

Accordingly, an improved frame structure and shot layout methodology are desirable.

BRIEF DESCRIPTION OF THE DRAWINGS

FIG. 1B illustrates a conventional shot area having a U-frame layout of integrated circuit chips and surrounding alignment and monitor patterns.

FIG. 1C illustrates a conventional shot area having an O-frame layout of integrated circuit chips and surrounding alignment and monitor patterns.

FIG. 4B illustrates one example of adjacent O-frame layouts being vertically shifted relative to one another in accordance with the O-frame layout illustrated in FIG. 3B.

FIG. 5B illustrates one example of a plurality of rows of shots being horizontally shifted.

FIG. 5C illustrates one example of a plurality of columns of shots being vertically shifted.

FIGS. 11A and 11B illustrate on example of a row of shots in accordance with the shot illustrated in FIG. 8C being shifted relative to other rows of shots.

DETAILED DESCRIPTION

An improved method of semiconductor wafer processing is now described. In the new processing method, a new frame structure including alignment and monitor patterns, e.g., frame structure segments, is implemented enabling rows or columns of shots to be partially shifted (offset) with respect to adjacent rows or columns of shots. As a result, a semiconductor wafer may be fully developed with fewer shots while retaining the chip count per wafer. Decreasing the number of shots required to fully develop a wafer and in turn maintaining or increasing the chip count per wafer increases the productivity of a production line as the amount of time to produce the same number of chips is reduced.

Figure 1A:
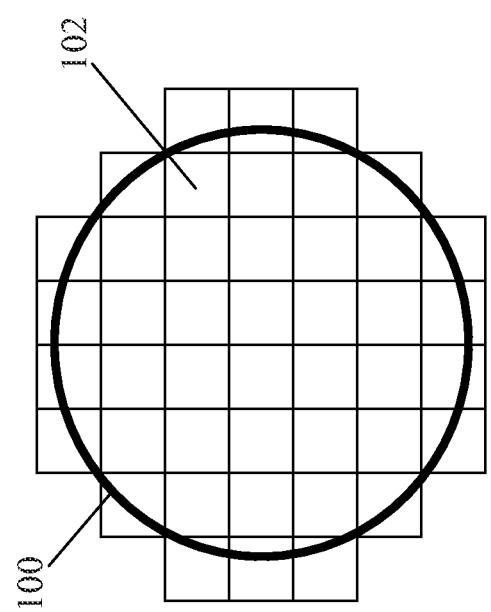
FIG. 1A illustrates a shot layout of a semiconductor wafer.
Figure 2B:
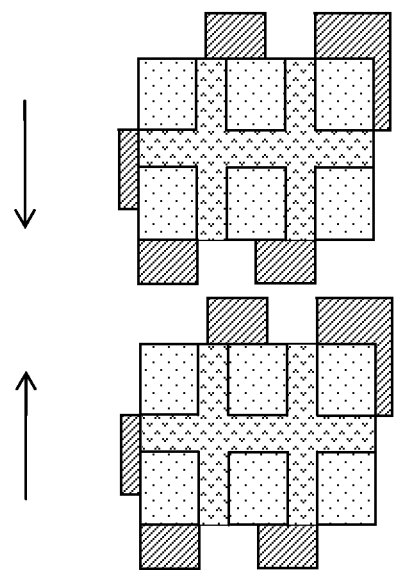
FIG. 2B illustrates two O-frame layouts being fit together.
Figure 2A:
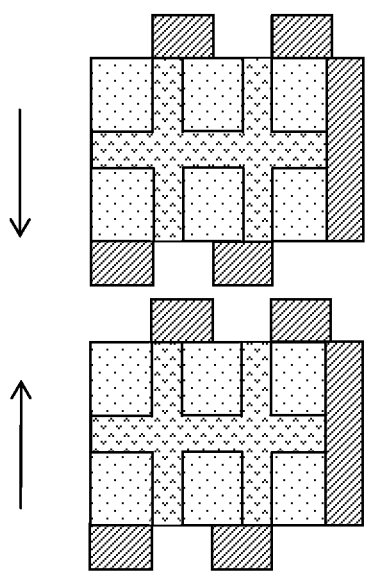
FIG. 2A illustrates two U-frame layouts being fit together.
Figure 3A:
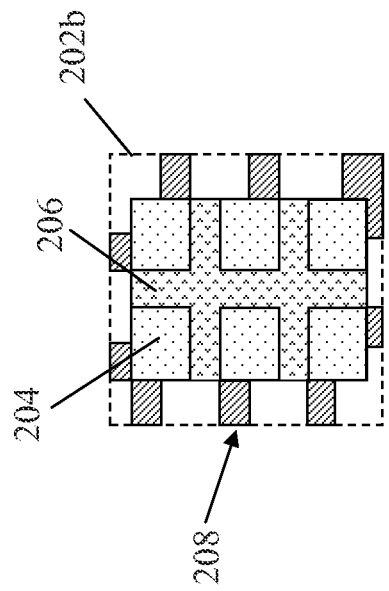
FIG. 3A illustrates one example of an improved shot cell layout having a U-frame configuration of integrated circuit chips and frame structure segments.
Figure 3B:
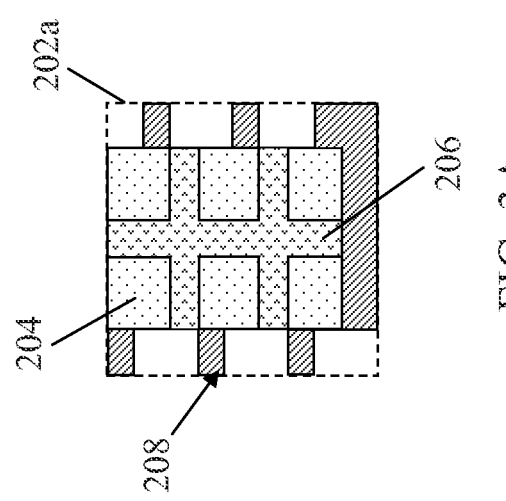
FIG. 3B illustrates one example of an improved shot cell layout having an O-frame configuration of integrated circuit chips and frame structure segments.

FIGS. 3A and 3B illustrate an improved frame structure for U-frames 202a and O-frames 202b, respectively. As shown in FIGS. 3A and 3B, the frame structure segments 208 are sized such that they are approximately one-half the size of the chips 204. Although the frame structure segments 208 are described as being reduced to a size of one-half the chip size, it is understood that frame structure segments 208 having other sizes that are less than the size of a chip may be implemented such as, for example, one-quarter chip size frame structure segments, one-eighth chip size frame structure segments, or the like. Larger frame structure sizes are also possible as will be understood by one of ordinary skill in the art. For the U-frame configuration illustrated in FIG. 3A, the frame structure segments 208 disposed on the left side of the shot 202a are located at the upper part of each chip 204, and the frame structure segments 208 on the right side of the shot 202a are located at the lower part of each chip 204. One skilled in the art will understand that the location of the frame structure segments 208 with respect to the chips 204 may be varied. As illustrated in FIG. 3B, the frame structure segments 208 are disposed on the upper or lower part of a chip 204 in the O-frame configuration, and the frame structure segments 208 arranged on the upper and lower edges of the shot 202b are disposed on the left or right side of the chips 204.

Figure 4A:
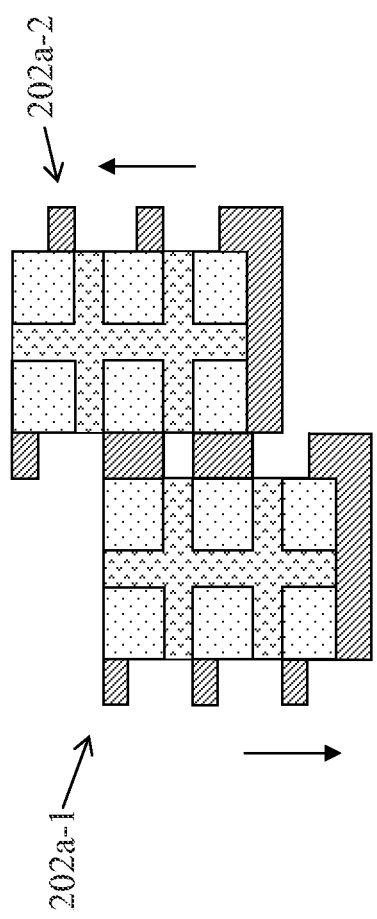
FIG. 4A illustrates one example of adjacent U-frame layouts being vertically shifted relative to one another in accordance with the U-frame layout illustrated in FIG. 3A.
Figure 4C:
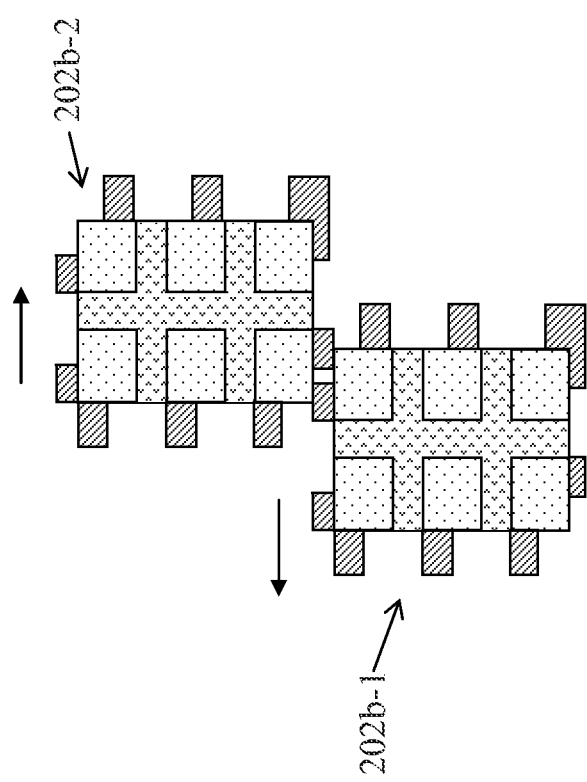
FIG. 4C illustrates one example of adjacent O-frame layouts being horizontally shifted relative to one another in accordance with the O-frame layout illustrated in FIG. 3B.

Reducing the size of the frame structure segments 208 enables adjacent shots, and consequently an entire row or column of shots, to be partially shifted with respect to each other as illustrated in FIGS. 4A-4C. The wafer may be exposed using a shot layout in which the frame structure segments 208 of an adjacent row or column of shots are staggered, i.e., offset, with respect to another row or column of shots.

As shown in FIG. 4A, adjacent shots in the U-frame configuration may be shifted up or down such that a top of one shot 202a-1 does not align with, e.g., is offset from, a top of an adjacent shot 202a-2. Shot areas 202b-1, 202b-2 having an O-frame configuration may be moved up or down or left or right with respect to adjacent shots as illustrated in FIGS. 4B and 4C, respectively.

Shifting adjacent rows or columns of shots enables a more flexible shot layout of a semiconductor wafer 200. The added flexibility enables shot layouts to be selected in which the total number of shots is reduced and/or the number of partial edge shots may be reduced while retaining or increasing the total chip count of a wafer compared to full vertical and horizontal alignment of shots. In some embodiments, the flexible shot layout enables a maximum number of chips per wafer to be obtained.

Figure 5A:
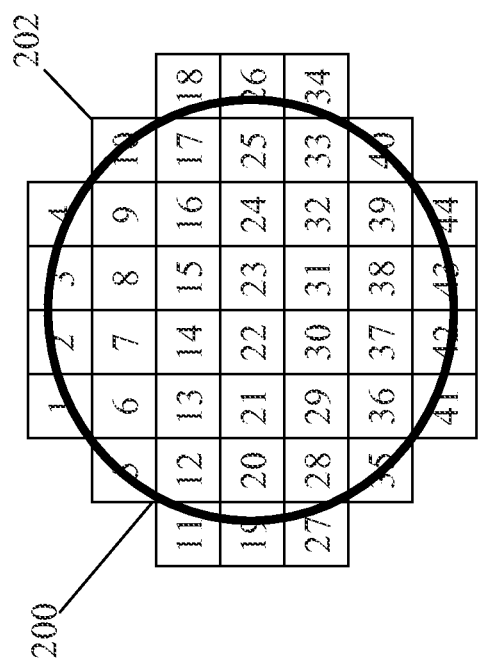
FIG. 5A illustrates one example of a layout of shots on a wafer.

FIG. 5A illustrates a semiconductor wafer 200, which may be fully developed in 44 shots 202, which are fully aligned with adjacent shots 202 in both the x- and y-directions. However, the frame structure segments 208 (not shown in FIG. 5A, see FIGS. 3A and 3B) in the shot areas 202 have a repeatable and reduced size that enables adjacent rows or columns of shots 202 to be shifted with respect to adjacent rows or columns of shots 202. The size and disposition of the frame structure segments enables the number of shots 202 needed to develop the entire wafer 200 to be reduced. For example, FIG. 5B illustrates a shot layout for the wafer 200 in which the third, fourth, and fifth rows from the top of the wafer 200 are shifted one chip size to the left as indicated by arrows 210. As shown in FIG. 5B, shifting the shots 202 in the third, fourth, and fifth rows to the left enables the wafer 200 to be fully developed by taking only 41 shots as shots 11, 19, and 27 may be eliminated since they are no longer located over any portion of the wafer 200. Although shots 11, 19, and 27 may be eliminated as they are moved off of the wafer, the chip count of the wafer is maintained as shots 18, 26, and 34 toward the interior of the wafer 200. Shots 18, 26, and 34 may be implemented such that they have more frame structure segments 208 compared to fully aligned shot layout in FIG. 5A, for process monitoring and to help check process variations during fabrication.

Alternatively, several of the columns of shots 202 may be shifted up or down as illustrated in FIG. 5C. As shown in FIG. 5C, by shifting the first, third, and sixth columns of shots 202 from the left edge of the wafer 200 upwards as indicated by arrows 212 and maintaining the position of the remaining columns of shots 202, shots 1, 4, and 11 may be eliminated as they are no longer over any part of the wafer 200. Shots 41 and 44 may be implemented with additional frame structure segments 208 for process monitoring and to help check for process variations during fabrication. Accordingly, the wafer 200 may be fully developed in 41 shots compared to the 44 shots required to fully develop a wafer where each of the shots are fully aligned with adjacent shots in the x- and y-directions. It is understood that these two examples of shifting rows or columns of shots is not exhaustive and this technique may also be implemented to reduce the number of partial edge shots. A partial edge shot is a shot area in which less than all of the chips within a shot are able to be developed due to the shot area being located over an edge of the wafer (e.g., shots 2 and 3 in FIG. 5A). Accordingly, reducing the number of edge shots may result in more chips being developed in fewer shots.

Figure 8A:
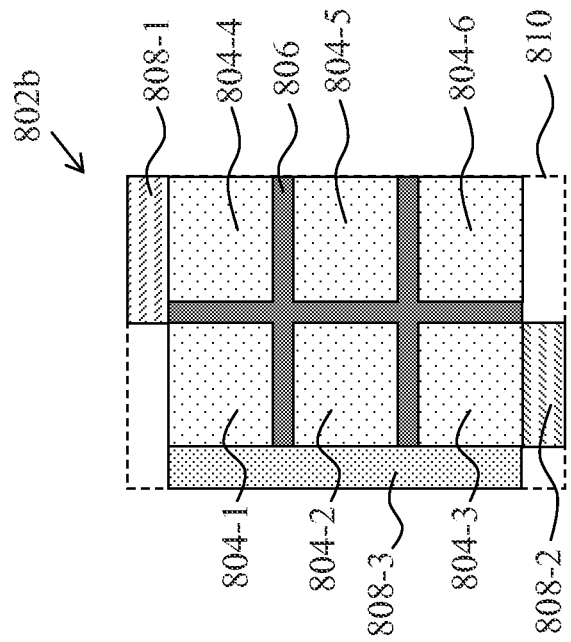
FIGS. 8A-8D illustrates other examples of an improved shot cell layouts.

Various shot areas may be used. For example, FIGS. 8A-8D illustrate other examples of improved shots 802a, 802b, 802c, and 802d. Referring first to FIG. 8A, shot 802a includes a plurality of dies or chips 804 separated by a scribe line 806. Frame structure segments 808 are disposed around the periphery of shot 802a with one side of shot 802a not including any frame structure segments 808 between the dies 804 and the boundary 810 of the shot. In the embodiment illustrated in FIG. 8A, for example, the left boundary 810 of shot 802a aligns with the left edge of dies 804-1, 804-2, and 804-3.

A frame structure segment 808-1 is positioned along the top of shot 802a, and a another frame structure segment 808-2 is disposed along the bottom of shot 802a. Frame structure segment 808-1 aligns with the edges of the die 804 disposed in the top right of shot 802a such that frame structure segment 808-1 has a length that is less than one half the width of shot 802a. Frame structure segment 808-2 extends from the left boundary 810 of shot 802a to the vertically extension of scribe line 806. A third frame structure segment 808-3 extends along the boundary 810 on the right side of shot 802a. In some embodiments, frame structure segment 808-3 extends the entire length of the three dies 804-4, 804-5, and 804-6 disposed on the right side of shot 802a.

Figure 8B:
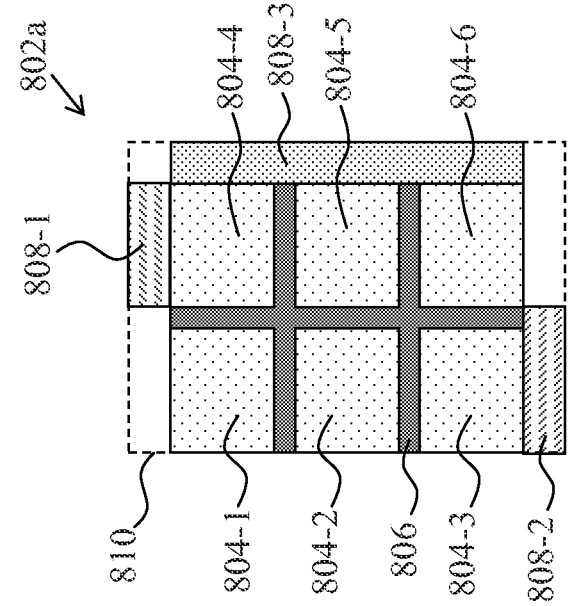

Turning now to FIG. 8B, shot 802b is also illustrated as including six dies 804-1, 804-2, 804-3, 804-4, 804-5, and 804-6 ("dies 804"), which are separated from one another by scribe line 806. Frame structure segment 808-1 is disposed along the top of shot 802b and extends from the right edge of boundary 810 to scribe line 806. Frame structure segment 808-2 is disposed along the bottom of shot 802b and has a length that extends along the edge of die 804-3. Frame structure segment 808-3 extends along the boundary 810 on the left side of shot 802b and extends from a top edge of die 804-1 to a bottom edge of die 804-3. The right side of shot 802b does not include a frame structure segment such that the edge of dies 804-4, 804-5, and 804-6 are aligned with the boundary 810 of shot 802b.

Figure 8D:
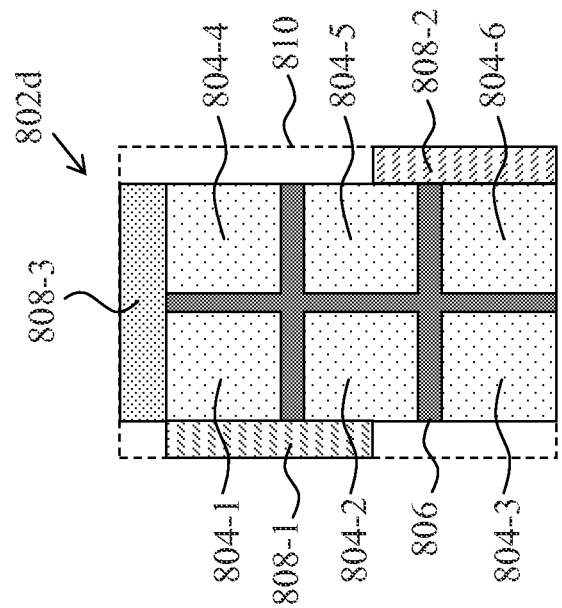
Figure 8C:
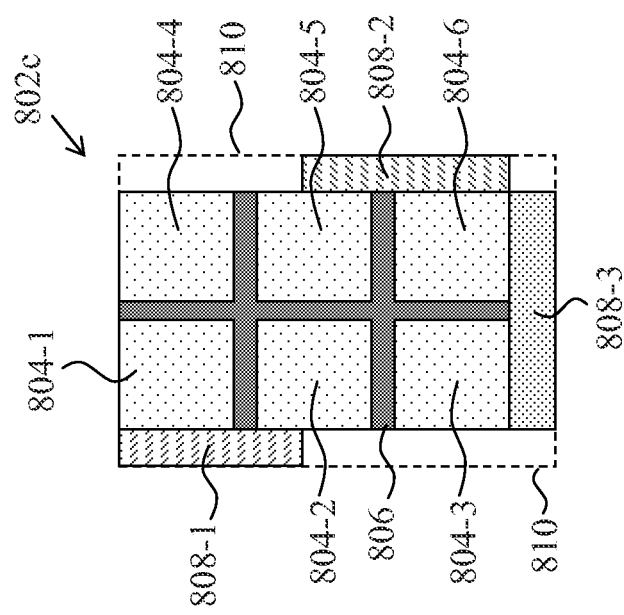

FIG. 8C illustrates another embodiment of an improved shot layout 802c that is configured for lateral shifting, e.g., the shifting of a row of shots relative to other rows of shots. As shown in FIG. 8C, chips 804-1 and 804-4 of shot layout 802c are aligned with the upper boundary 810 of shot 802c. A first frame structure segment 808-1 is disposed along the left edge of boundary 810 and extends from the upper boundary to a location along chip 804-2. The right side of layout 802*c* includes a second frame structure segment 808-2, and a third frame structure segment 808-3 is disposed along the bottom of shot 802*c*.

FIG. 8D illustrates another embodiment of a shot layout 802*d* configured for lateral shifting. Shot layout 802*d* includes a plurality of dies/chips 804 separated by scribe line 806. Frame structure segments 808-1, 808-2, and 808-3 are disposed around the periphery of shot layout 802*d*. The bottom edges of chips 804-3 and 804-6 are aligned with the boundary 810 along the bottom of layout 802*d*. Frame structure segment 808-1 is disposed between chips 804-1, 804-2 and the boundary of shot 802*d*, and frame structure segment 808-2 is disposed between chips 804-5, 804-6 and boundary 810 of shot 802*d*. Frame structure segment 808-3 is disposed along the upper edge of boundary 810 and directly adjacent to the upper edges of chips 804-1 and 804-4.

The shot layouts 802*a*, 802*b*, 802*c*, and 802*d* illustrated in FIGS. 8A-8D enable columns or rows of shots to be shifted relative to adjacent columns or rows of shots. For example, FIG. 9A illustrates a plurality of shots 802*a* arranged in aligned columns 902 and rows 904. The frame structure segments of shot layout 802*a* are configured such that the frame structure segments of adjacent shots 802*a* intersect with each other without overlapping.

Figure 9B:
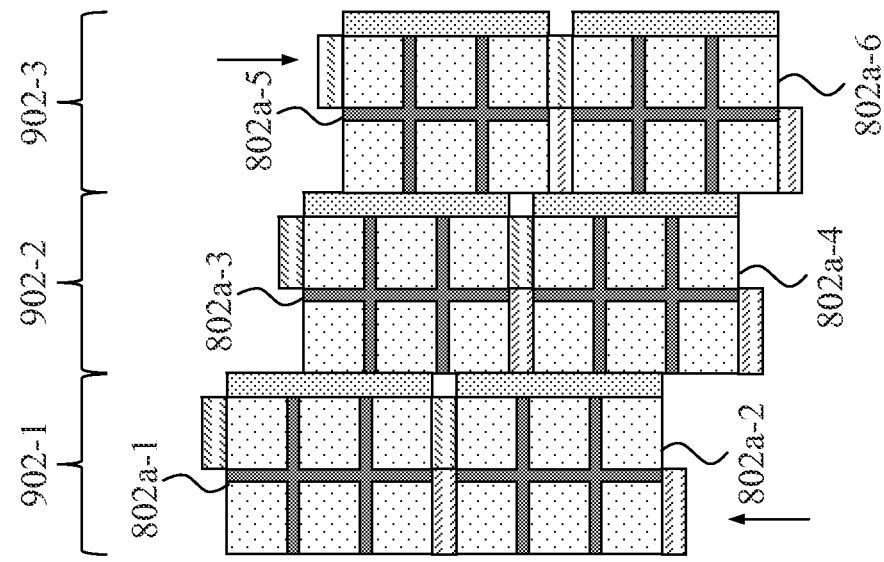
FIGS. 9A and 9B illustrate one example of columns of shots in accordance with the shot illustrated in FIG. 8A being shifted relative to another column of shots.
Figure 9A:
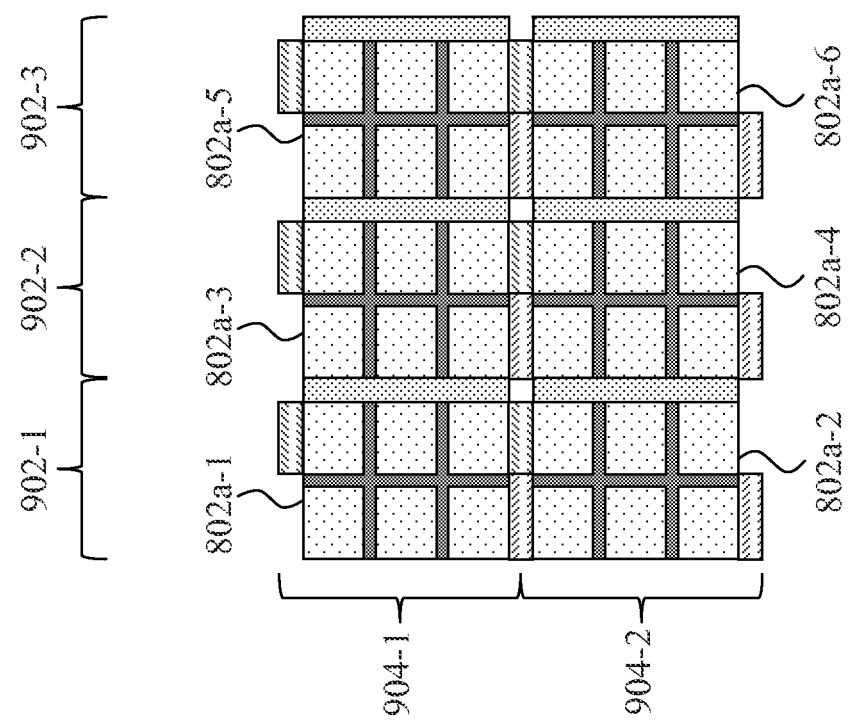

As illustrated in FIG. 9B, the shot layout 802*a* enables a columns 902-1 and 902-3 of shots 802*a* to be shifted relative column 902-2. For example, column 902-1 is shifted up with reference to column 902-2, and column 902-3 is shifted down relative to column 902-2. As will be understood by one of ordinary skill in the art, the distance one column is shifted relative to an adjacent column may vary. The shifting of a column of shots may eliminate the alignment of a row of shots. For example, shifting column 902-1 relative to column 902-2 results in shot 802*a*-1 not being aligned with shot 802*a*-3 and shot 802*a*-2 not being aligned with shot 802*a*-4.

Figures 10A, 10B:
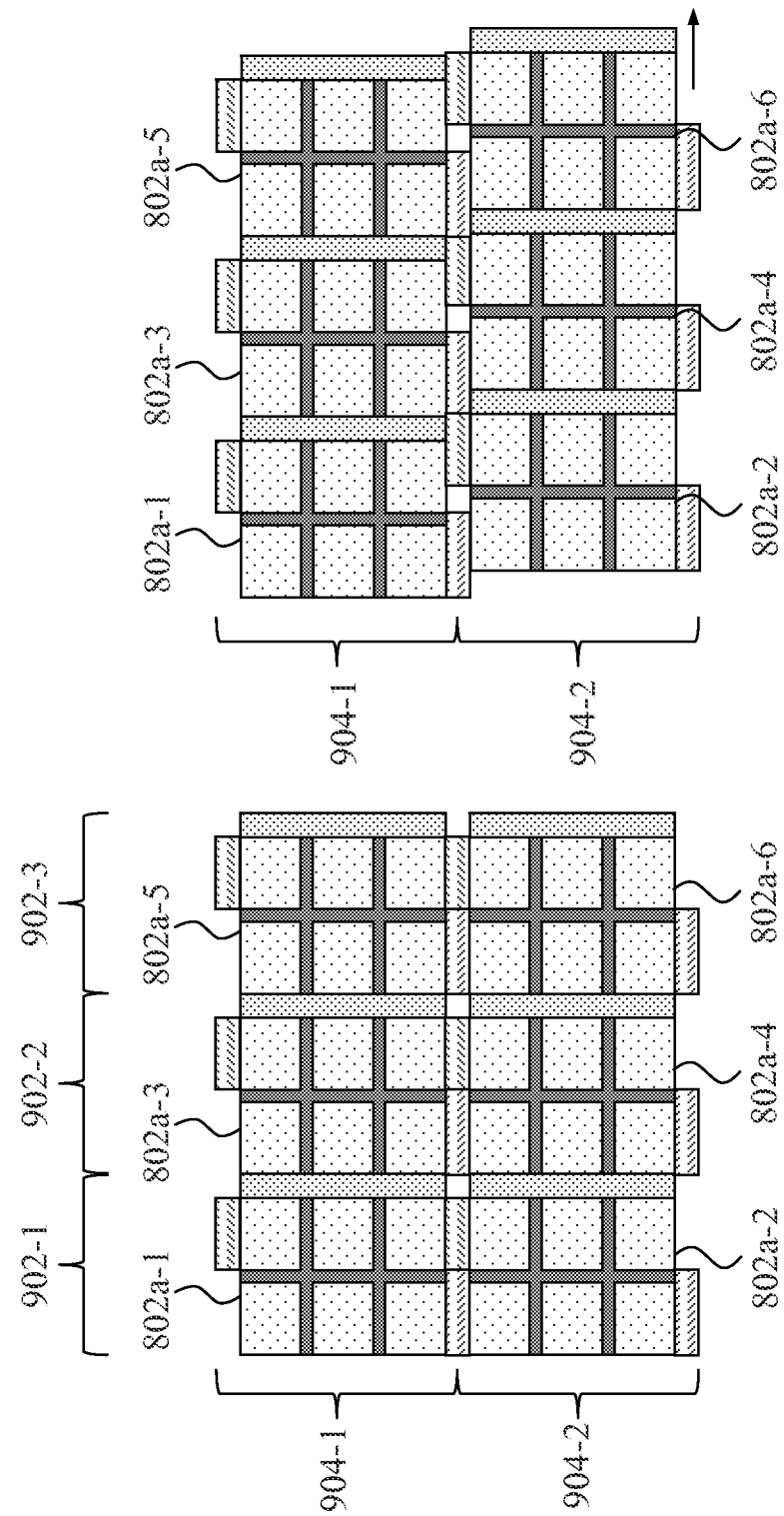
FIGS. 10A and 10B illustrate one example of a row of shots in accordance with the shot illustrated in FIG. 8A being shifted relative to another row of shots.

FIGS. 10A and 10B illustrate the shifting of a row of shots 802*a*. In particular, FIG. 10A illustrates an initial position in which the shots 802*a* are aligned in columns 902 and rows 904. In FIG. 10B, row 904-2 is shifted to the right relative to row 904-1. Shifting of adjacent rows 904 results in the shots 802*a* in adjacent columns no longer being aligned. For example, the left and right edges of shots 802*a*-1, 802*a*-3, and 802*a*-5 are not aligned with the respective left and right edges of shots 802*a*-2, 802*a*-4, and 802*a*-6.

FIGS. 11A and 11B illustrate the shifting of a row of shots 802*c* relative to another row of shots 802*c*. In FIG. 11A, shots 802*c* are arranged in aligned columns 1102 and rows 1104. In FIG. 11B, row 1104-3 is shifted to the right relative to rows 1104-1 and 1104-2 as indicated by the arrow. Shifting row 1104-3 results in the shots in row 1104-3, i.e., shots 802*c*-3 and 802*c*-6, not being vertically aligned with the shots in rows 1104-1 and 1104-2, i.e., shots 802*c*-1, 802*c*-2, 802*c*-4, and 802*c*-5.

Figure 6:
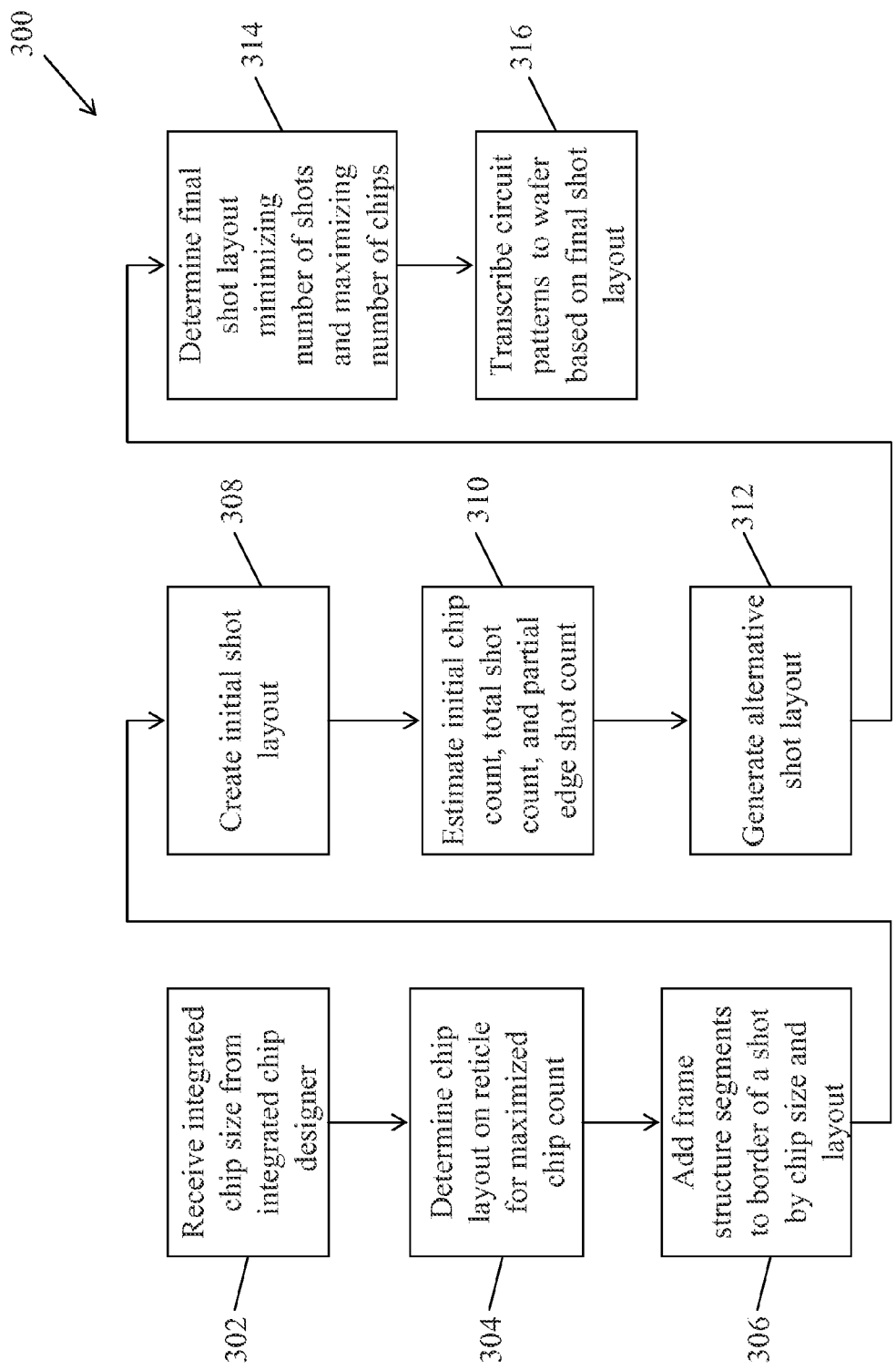
FIG. 6 is a flow diagram of one example of an improved method of determining a frame structure on a reticle and a shot layout of a wafer.

FIG. 6 illustrates one example of a method 300 of designing a shot layout for a semiconductor wafer. At block 302, a final design for an integrated circuit chip is received from a designer identifying a chip size. The chip layout that provides the maximum chip count on the reticle is determined at block 304. When determining the chip layout on the reticle, space at the periphery of each shot 202, 802 is retained for frame structures 208, 808.

At block 306, the size of a chip is used to determine the size of each frame structure segment 208. In some embodiments, the frame structure segments 208, 808 have a size that is approximately one-half of the size of the integrated circuit chips 204, 804, although it is understood that the frame structure segments may be of any other fractional size that is less than the size of the integrated circuit chips 204, 804, e.g., three-quarters of the chip size, one-quarter of the chip size, etc. The frame structure segments 208, 808 are added to the periphery of a shot 202, 802 configuration on the reticle. In some embodiments, the pattern of the frame structure segments 208, 808 are selected from existing frame structure segment patterns stored in a computer readable storage medium. In some embodiments, the frame structure segments are customized to fit the particular shot area.

At block 308, an initial shot layout is created in which each of the shots 202, 802 are fully aligned with adjacent shots in both vertically and horizontally (e.g., in both the x- and y-directions) as illustrated in FIGS. 5A, 9A, 10A, and 11A. The shot layout is placed over the wafer 200 at an initial starting point, the number of chips that the wafer will provide when fully developed, e.g., initial chip count, is determined at block 310. The initial chip count value may be stored in a database along with the number of shots required to fully develop the wafer 200. The number of partial edge shots may also be determined and stored in a computer readable storage medium.

At block 312, one or more alternative shot layouts are generated. The one or more alternative shot layouts may be generated in which the fully aligned shot layout is offset from the initial starting point on the wafer, or one or more rows or columns of shots may be shifted (e.g., offset) with respect to an adjacent row or column of shots as illustrated in FIGS. 5B, 5C, 9B, 10B, and 11B. As described above, the one or more rows or columns of shots may be offset with respect to an adjacent row or column of shots based on the size of a frame structure segment 208, 808.

For example, if a frame structure segment 208, 808 is implemented having a size that is approximately one-half the size of the chip, then a row or column of shots may be shifted or offset one chip size with respect to an adjacent row or column of shots. One skilled in the art will understand that if a smaller size of a frame structure segment 208, 808 is used, e.g., one-quarter chip size, then a row or column of shots 202, 802 may be shifted by a half-chip size, one chip size, two chip sizes, or the like with respect to an adjacent row or column of shots. An algorithm, such as the one disclosed in U.S. Pat. No. 7,353,077 issued to Lin et al., the entirety of which is incorporated by reference herein, may be used to optimize the shot layout.

The final shot layout is selected at block 314. The selection of the final shot layout may be performed by comparing the initial shot layout with each of the one or more alternative shot layouts. A number of factors may be taken into consideration when selecting the final shot layout including, but not limited to, the total chip count, the total number of shots required to fully develop the wafer, the number of partial edge shots, and/or the yield estimation of chips in partial edge shots. For example, the final shot layout that is selected may have a tradeoff between the total number of shots and the lowest number of partial edge shots while at the same time having a total chip count that is greater than or equal to the initial chip count. In another example, the shot layout that is selected for the final shot layout may be layout having the highest chip count with the fewest number of total shots. In some embodiments, the shot layout is selected that maximizes the number of chips per wafer.

The circuit pattern may be transcribed onto the wafer based on the final shot layout at block 316. The circuit pattern may be transcribed onto the wafer shot-by-shot by passing UV light through the reticle using a lithographic device. As described above, the lithographic device may take a plurality of shots to fully transcribe the circuit pattern onto the wafer such that the wafer is fully developed and the location of these shots is based on the final shot layout.

Figure 7:
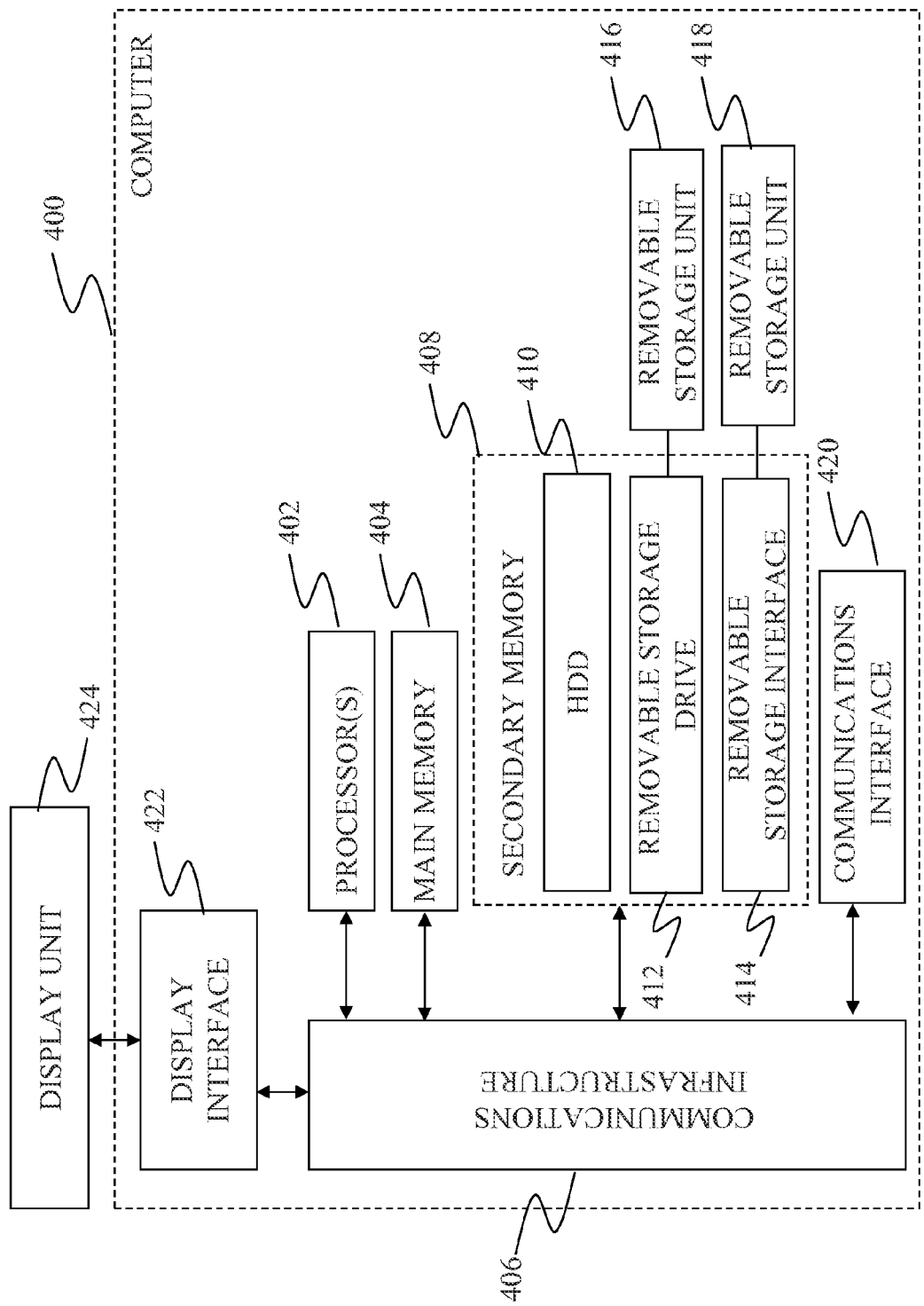
FIG. 7 is a block diagram of one example of a computer system that may be used to determine the shot layout on a wafer.

The method may be implemented using hardware, software, or a combination thereof and may be implemented in one or more computer systems or other processing systems. In one embodiment, the method is carried out in a computer system as illustrated in FIG. 7. As illustrated in FIG. 7, computer system 400 may include one or more processors, such as processor 402. The processor 402 is connected to a communication infrastructure 406 (e.g., a communications bus, cross-over bar, or network). Computer system 400 may include a display interface 422 that forwards graphics, text, and other data from the communication infrastructure 406 (or from a frame buffer not shown) for display on the display unit 424.

Computer system also includes a main memory 404, such as a random access (RAM) memory, and may also include a secondary memory 408. The secondary memory 408 may include, for example, a hard disk drive (HDD) 410 and/or removable storage drive 412, representing a floppy disk drive, a magnetic tape drive, an optical disk drive, or the like. The removable storage drive 412 reads from and/or writes to a removable storage unit 416. Removable storage unit 416 may be a floppy disk, magnetic tape, optical disk, or the like. As will be understood, the removable storage unit 416 may include a computer readable storage medium having stored therein computer software and/or data.

In alternative embodiments, secondary memory 408 may include other similar devices for allowing computer programs or other instructions to be loaded into computer system 400. Secondary memory 408 may include a removable storage unit 418 and a corresponding interface 414. Examples of such removable storage units include, but are not limited to, a USB or flash drives, which allow software and data to be transferred from the removable storage unit 418 to computer system 400.

Computer system 400 may also include a communications interface 420. Communications interface 420 allows software and data to be transferred between computer system 400 and external devices. Examples of communications interface 420 may include a modem, Ethernet card, wireless network card, a Personal Computer Memory Card International Association (PCMCIA) slot and card, or the like. Software and data transferred via communications interface 420 may be in the form of signals, which may be electronic, electromagnetic, optical, or the like that are capable of being received by communications interface 420. These signals may be provided to communications interface 420 via a communications path (e.g., channel), which may be implemented using wire, cable, fiber optics, a telephone line, a cellular link, a radio frequency (RF) link and other communication channels.

In this document, the terms "computer program medium" and "computer readable storage medium" refer to media such as removable storage drive 412, or a hard disk installed in hard disk drive 410. These computer program products provide software to computer system 400. Computer programs (also referred to as computer control logic) are stored in main memory 404 and/or secondary memory 408. Computer programs may also be received via communications interface 420. Such computer programs, when executed by a processor, enable the computer system 400 to perform the features of the method discussed herein. For example, main memory 404, secondary memory 408, or removable storage units 416 or 418 may be encoded with computer program code for performing the process shown in FIG. 6.

In some embodiments, a method includes establishing an initial shot layout in which a number of shots are arranged in vertically aligned columns and horizontally aligned rows to cover a semiconductor wafer. At least one of a row of shots or a column of shots is shifted relative to an adjacent row or column of shots to establish at least one additional shot layout that differs from the initial shot layout in that shots in the at least one shifted row or column of shots are not aligned with the shots in the adjacent row or column of shots with which they were aligned in the initial shot layout. One of the initial shot layout and the at least one additional shot layout is selected as a final shot layout. The wafer is exposed to light using the final shot layout.

In some embodiments, a system includes a computer readable storage medium and a processor in signal communication with the computer readable storage medium. The processor is configured to establish an initial shot layout in which a number of shots are arranged in vertically aligned columns and horizontally aligned rows to cover a semiconductor wafer, shift at least one of a row of shots or a column of shots relative to an adjacent row or column of shots to establish at least one additional shot layout that differs from the initial shot layout in that shots in the at least one shifted row or column of shots are not aligned with the shots in the adjacent row or column of shots with which they were aligned in the initial shot layout, and select one of the initial shot layout and the at least one additional shot layout as a final shot layout.

In some embodiments, a computer readable storage medium is encoded with program code. A processor performs a method when the program code is executed by the processor. The method includes establishing an initial shot layout in which a number of shots are arranged in vertically aligned columns and horizontally aligned rows to cover a semiconductor wafer. At least one of a row of shots or a column of shots is shifted relative to an adjacent row or column of shots to establish at least one additional shot layout that differs from the initial shot layout in that shots in the at least one shifted row or column of shots are not aligned with the shots in the adjacent row or column of shots with which they were aligned in the initial shot layout. One of the initial shot layout and the at least one additional shot layout is selected as a final shot layout.

In some embodiments, a semiconductor wafer includes a first row or column of dies disposed on the wafer and a second row or column of dies disposed adjacent to the first row or column of dies on the wafer. Each of the dies in the first row or column of dies is linearly aligned with the other dies in the first row or column of dies. Each of the dies in the second row or column of dies is linearly aligned with the other dies in the second row or column of dies. The dies in the second row or column of dies are offset from a respective die in the first row or column of dies such that the dies in the first row or column of dies are not linearly aligned with the dies in the second row or column of dies.

In an embodiment implemented using software, the software may be stored in a computer program product and loaded into computer system 400 using removable storage drive 412, hard drive 410, or communications interface 420. The software, when executed by a processor 402, causes the processor 402 to perform the functions of the method described herein. In another embodiment, the method may be implemented primarily in hardware using, for example, hardware components such as a digital signal processor comprising application specific integrated circuits (ASICs). In yet another embodiment, the method is implemented using a combination of both hardware and software.

In addition to the above described embodiments, the disclosed method and apparatus may be embodied in the form of computer-implemented processes and apparatus for practicing those processes. The present disclosed method and apparatus may also be embodied in the form of computer program code embodied in tangible media, such as floppy diskettes, read only memories (ROMs), CD-ROMs, hard drives, "ZIP™" high density disk drives, DVD-ROMs, Blu-ray discs, flash memory drives, or any other computer-readable storage medium, wherein, when the computer program code is loaded into and executed by a computer, the computer becomes an apparatus for practicing the disclosed method and system. The present disclosed method and apparatus may also be embodied in the form of computer program code, for example, whether stored in a storage medium, loaded into and/or executed by a computer, wherein, when the computer program code is loaded into and executed by a computer, the computer becomes an apparatus for practicing the disclosed method and apparatus. When implemented on a general-purpose processor, the computer program code segments configure the processor to create specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor processing method, comprising:
   establishing an initial shot layout in which a number of shots are arranged in vertically aligned columns and horizontally aligned rows to cover a semiconductor wafer, each shot including
      a respective shot area defined by a length and a width, and
      at least one frame structure segment that enables the shot to be shifted relative to an adjacent shot area by a distance that is less than the length of the shot being shifted;
   shifting at least one of a row of shots or a column of shots relative to an adjacent row or column of shots to establish at least one additional shot layout that differs from the initial shot layout in that shots in the at least one shifted row or column of shots are not aligned with the shots in the adjacent row or column of shots with which they were aligned in the initial shot layout;
   selecting one of the initial shot layout and the at least one additional shot layout as a final shot layout; and
   exposing the semiconductor wafer to light in accordance with the final shot layout using a lithographic device.

2. The method of claim 1, further comprising arranging the at least one frame structure segment around a periphery of each of the shots in the initial shot layout.

3. The method of claim 2, wherein each shot includes at least one chip.

4. The method of claim 3, wherein a frame structure segment size is one-half a chip size.

5. The method of claim 1, wherein each shot includes at least one chip, and a number of chips in the final shot layout is greater than a number of chips in the initial shot layout.

6. The method of claim 1, wherein at least one column of shots in the final shot layout is shifted with respect to at least one other column of shots.

7. The method of claim 1, wherein the final shot layout is selected to maximize the chip count per wafer.

8. The method of claim 1, wherein the at least one additional shot layout includes a second additional shot layout, the second additional shot layout including vertically aligned columns and horizontally aligned rows of shots that are disposed at different locations over the wafer compared to the initial shot layout.

9. A semiconductor processing system, comprising:
   a computer readable storage medium; and
   a processor in signal communication with the computer readable storage medium, the processor configured to:
      establish an initial shot layout in which a number of shots are arranged in vertically aligned columns and horizontally aligned rows to cover a semiconductor wafer, each shot including
         a respective shot area defined by a length and a width, and
         at least one frame structure segment that enables the shot to be shifted relative to an adjacent shot area by a distance that is less than the length of the shot being shifted;
      shift at least one of a row of shots or a column of shots relative to an adjacent row or column of shots to establish at least one additional shot layout that differs from the initial shot layout in that shots in the at least one shifted row or column of shots are not aligned with the shots in the adjacent row or column of shots with which they were aligned in the initial shot layout; and
      select one of the initial shot layout and the at least one additional shot layout as a final shot layout.

10. The system of claim 9, wherein the processor is configured to arrange the at least one frame structure segment around a periphery of each of the shots in the initial shot layout.

11. The system of claim 9, wherein each shot includes at least one chip.

12. The system of claim 11, wherein a number of chips in the final shot layout is greater than a number of chips in the initial shot layout.

13. The system of claim 9, wherein at least one column of shots in the final shot layout is shifted with respect to at least one other column of shots.

14. A semiconductor wafer, comprising:
   a first row or column of dies disposed on the semiconductor wafer, each of the dies in the first row or column of dies linearly aligned with the other dies in the first row or column of dies; and
   a second row or column of dies disposed on the semiconductor wafer adjacent to the first row or column of dies, each of the dies in the second row or column of dies linearly aligned with the other dies in the second row or column of dies, the dies in the second row or column of dies being offset from a respective die in the first row or column of dies such that the dies in the first row or column of dies are not linearly aligned with the dies in the second row or column of dies.

15. The semiconductor wafer of claim 14, further comprising a third row or column of dies disposed on the wafer, the dies in the third row or column of dies being linearly aligned with the other dies in the third row or column of dies and with a respective die in the first row or column of dies.

16. The semiconductor wafer of claim 14, wherein each of the dies in the first and second row or column of dies is disposed adjacent to a frame structure segment.

17. The semiconductor wafer of claim 14, wherein at least one of the dies in the first row or column of dies is separated from another die in the first row or column of dies by a scribe line.

18. The semiconductor wafer of claim 17, wherein at least one of the dies in the second row or column of dies is separated from another die in the second row or column of dies by a scribe line.

19. The semiconductor wafer of claim 14, further comprising a plurality of rows or columns of dies disposed on the semiconductor wafer, each die in a respective row or column of dies being linearly aligned with the other dies in the respective row or column of dies and with the dies in the first row or column of dies.

* * * * *